United States Patent
Chen

(10) Patent No.: US 9,589,610 B1
(45) Date of Patent: Mar. 7, 2017

(54) MEMORY CIRCUIT INCLUDING PRE-CHARGING UNIT, SENSING UNIT, AND SINK UNIT AND METHOD FOR OPERATING SAME

(71) Applicant: Macronix International Co., Ltd., Hsinchu (TW)

(72) Inventor: Chung-Kuang Chen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/845,661

(22) Filed: Sep. 4, 2015

(51) Int. Cl.
G11C 7/00 (2006.01)
G11C 7/12 (2006.01)

(52) U.S. Cl.
CPC .................................... G11C 7/12 (2013.01)

(58) Field of Classification Search
CPC . G11C 11/5642; G11C 11/5628; G11C 16/10; G11C 16/0425; G11C 2211/5641; G11C 11/5692; G11C 16/26; G11C 7/067; G11C 7/12; G11C 17/12; G11C 7/02; G11C 15/04; G11C 7/065; G11C 7/08
See application file for complete search history.

(56) References Cited

U.S. PATENT DOCUMENTS

| | | | |
|---|---|---|---|
| 7,965,551 B2 * | 6/2011 | Ho ........................... | G11C 7/18 365/185.05 |
| 8,134,853 B2 * | 3/2012 | Fastow .................. | G11C 16/24 257/E21.409 |
| 2009/0109728 A1 * | 4/2009 | Maejima ................. | G11C 11/56 365/148 |
| 2011/0317466 A1 * | 12/2011 | Fastow .................. | G11C 5/063 365/72 |
| 2015/0003151 A1 * | 1/2015 | Lee ........................ | G11C 16/10 365/185.02 |

* cited by examiner

*Primary Examiner* — Hien Nguyen
(74) *Attorney, Agent, or Firm* — Finnegan, Henderson, Farabow, Garrett & Dunner LLP

(57) ABSTRACT

A memory circuit includes a pre-charging unit configured to charge a metal bit line during a pre-charging period, a sensing unit configured to sense a status of a memory cell coupled to the metal bit line during the pre-charging period, and a sink circuit configured to provide a sink current during the pre-charging period based on the status of the memory cell sensed by the sensing unit.

17 Claims, 8 Drawing Sheets

MEMORY CIRCUIT INCLUDING PRE-CHARGING UNIT, SENSING UNIT, AND SINK UNIT AND METHOD FOR OPERATING SAME

FIELD OF THE DISCLOSURE

The present disclosure relates to a memory circuit and a method for operating the same and, more particularly, to a memory circuit and a method for operating the memory circuit with pre-charging of a metal bit line.

BACKGROUND

Memory devices have become increasingly popular in various electronic devices. In a memory device, a plurality of groups of memory cells (e.g., memory strings) are coupled to corresponding ones of a plurality of metal bit lines that are pre-charged to a predetermined voltage level. Data stored in a memory cell in a memory string can be sensed by applying a select voltage to the memory cell and sensing the current on the corresponding metal bit line. However, due to the increasing density of memory cells, smaller cell current, and large loadings of the metal bit lines, the time required for pre-charging the metal bit lines become longer.

SUMMARY

According to an embodiment of the disclosure, a memory circuit includes a pre-charging unit configured to charge a metal bit line during a pre-charging period, and a sensing unit configured to sense a status of a memory cell coupled to the metal bit line during the pre-charging period.

According to another embodiment of the disclosure, a method of operating a memory circuit includes charging, by a pre-charging unit, a metal bit line during a pre-charging period, and sensing, by a sensing unit, a status of a memory cell coupled to the metal bit line during the pre-charging period.

According to still another embodiment of the disclosure, a memory system includes a memory array including a plurality of metal bit lines respectively coupled to corresponding ones of a plurality of strings of memory cells, and a memory controller coupled to the memory array for providing signals to the memory array to charge a metal bit line during a pre-charging period, and sense a status of a memory cell coupled to the metal bit line during the pre-charging period.

The accompanying drawings, which are incorporated in and constitute a part of this application, illustrate disclosed embodiments and, together with the description, serve to explain the disclosed embodiments.

DETAILED DESCRIPTION

Reference will now be made in detail to the present embodiments, examples of which are illustrated in the accompanying drawings. Wherever possible, the same reference numbers will be used throughout the drawings to refer to the same or like pads.

Figure 1:
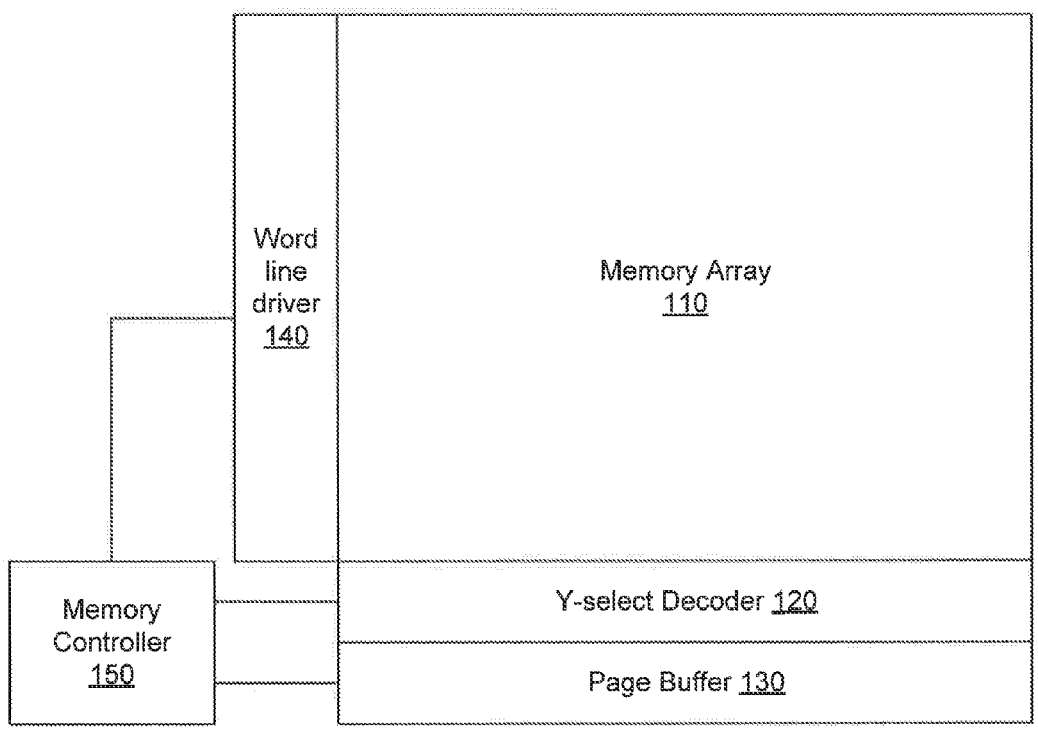
FIG. 1 is a block diagram of a memory chip, according to an illustrated embodiment.

FIG. 1 is a block diagram of a memory chip 100, according to an illustrated embodiment. Memory chip 100 includes a memory array 110, a Y-select decoder 120, a page buffer 130, a word line driver 140, and a memory controller 150. Memory array 110 includes a plurality of memory cells arranged in rows and columns, Y-select decoder 120 accesses selected columns of memory cells in memory array 110. Page buffer 130 stores data to be programmed to memory array 110, or data read from memory array 110. Word line driver 140 accesses selected rows of memory cells in memory array 110. Memory controller 150 generates and applies various control signals to memory array 110, Y-select decoder 120, page buffer 130, and WL driver 140.

Figure 2:
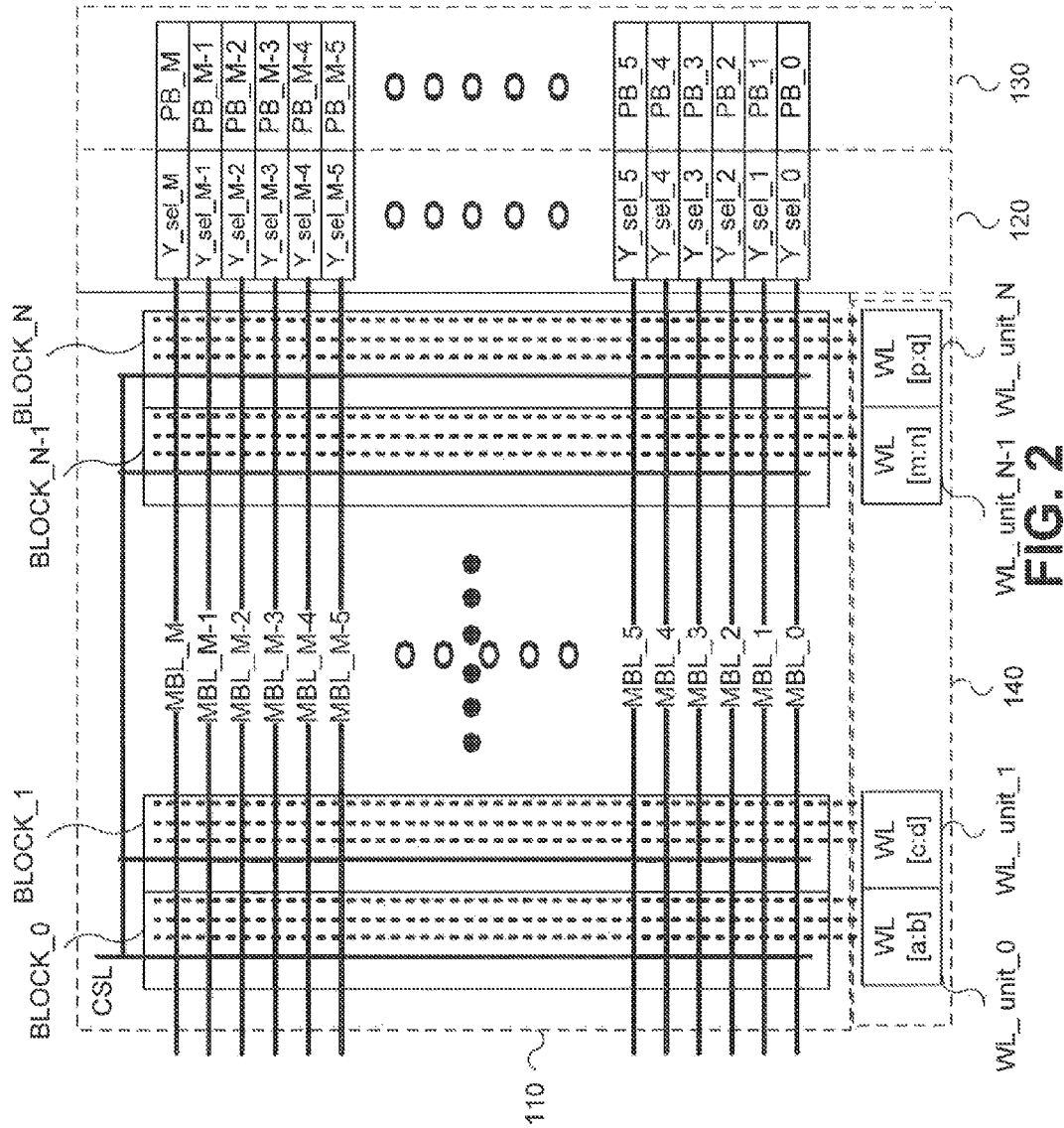
FIG. 2 is a simplified circuit diagram of various parts of the memory chip illustrated in FIG. 1, according to an illustrated embodiment.

FIG. 2 is a simplified circuit diagram of various parts of memory chip 100 illustrated in FIG. 1, according to an illustrated embodiment. Memory array 110 includes N+1 blocks BLOCK_0, BLOCK_1, . . . , BLOCK_N−1, and BLOCK_N, of memory cells, where N is a natural number equal to or greater than 1. Each one of blocks BLOCK_0, BLOCK_1, . . . , BLOCK_N−1, and BLOCK_N includes a row of memory cells having substantially the same structure. Memory array 110 also includes M metal bit lines MBL_0, MBL_1, . . . , MBL_M−1, and MBL_M, where M is a natural number greater than 1. Each one of MBLs MBL_0, MBL_1, . . . , MBL_M−1, and MBL_M is coupled to a column of memory cells. A common source line CSL is coupled to the memory cells in each one of blocks BLOCK_0, BLOCK_1, . . . , BLOCK_N−1, and BLOCK_N.

Y-select decoder 120 includes M+1 Y-select units Y_sel_0, Y_sel_1, . . . , Y_sel_M−1 and Y_sel_M, where M is a natural number equal to or greater than 1. Each one of Y-select units Y_sel_0, Y_sel_1, . . . , Y_sel_M−1, and Y_sel_M is coupled to a corresponding one of metal bit lines MBL_0, MBL_1, . . . , MBL_M−1, and MBL_M. Y-select units Y_sel_0, Y_sel_1, . . . , Y_sel_M−1, and have substantially the same circuit structure. Page buffer 130 includes M+1 page buffer units PB_0, PB_1, . . . , PM_M−1, and PM_M, each being coupled to a corresponding one of Y-select units Y_sel_0, Y_sel_1, . . . , Y_sel_M−1, and Y_sel_M. Page buffer units PB_0, PB_1, . . . , PM_M−1, and PM_M have substantially the same circuit structure. Word line driver 140 includes word line driver units WL_unit_0, WL_unit_1, . . . , WL_unit_N−1, and WL_unit_N, each being coupled to a plurality of word lines in a corresponding block BLOCK_0, BLOCK_1, . . . , BLOCK_N−1, and BLOCK_N, respectively. For example, WL_unit_0 is coupled to word lines WL[a:b] in BLOCK_0; WL_unit_1 is coupled to WL[c:d] in BLOCK_1; WL_unit_N−1 is coupled to WL[m:n] in BLOCK_N−1; and WL_unit_N is coupled to WL[p:q] in BLOCK_0.

Figure 3:
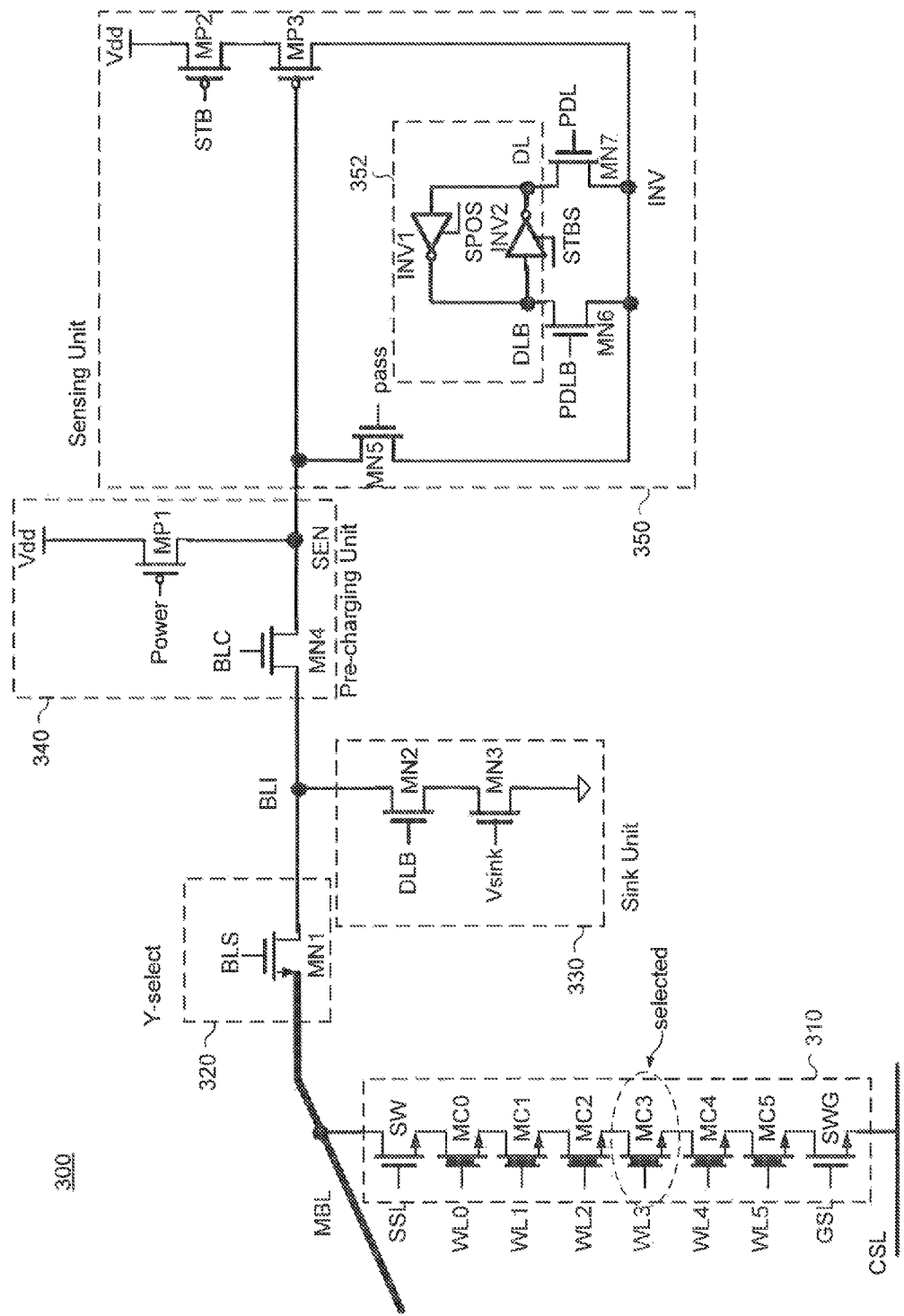
FIG. 3 is a circuit diagram of a memory circuit, according to an illustrated embodiment.

FIG. 3 is a circuit diagram of a memory circuit 300, according to an illustrated embodiment. As illustrated in FIG. 3, memory circuit 300 includes a memory string 310, a Y-select unit 320, a sink unit 330, a pre-charging unit 340, and a sensing unit 350. Memory string 310 corresponds to a column of memory cells in memory array 110 illustrated in FIG. 2. Y-select unit 320 corresponds to one of Y-select units Y_sel_0, Y_sel_1, . . . , Y_sel_M−1, and Y_sel_M illustrated in FIG. 2. Sink unit 330, pre-charging unit 340, and sensing unit 350 constitute one of page buffer units PB_0, PB_1, . . . , PM_M−1, and PM_M illustrated in FIG. 2. WL0~WL5 are connected to word line driver 140.

As illustrated in FIG. 3, memory string 310 includes a plurality of (e.g., six as illustrated in FIG. 3) memory cells MC0, MC1, . . . , MC5, a string select switch SW, and a ground select switch SWG, that are coupled between a metal bit line MBL and common source line CSL. Metal bit line MBL in FIG. 3 corresponds to one of metal bit lines MBL_0, MBL_1, . . . , MBL_M−1, and MBL_M illustrated in FIG. 2. Word lines WL0, WL1, . . . , WL5 in FIG. 3 correspond to some of word lines WL[a:q] illustrated in FIG. 2. The plurality of memory cells MC0, MC1, . . . , MC5, are coupled in series between string select switch SW and ground select switch SWG. The plurality of memory cells MC0, MC1, . . . , MC5, are implemented as metal oxide semiconductor (MOS) transistors each with a programmable threshold voltage. Each one of memory cells MC0, MC1, . . . , MC5, includes a gate electrode coupled to a corresponding one of word lines ML0, ML1, . . . , ML5 to receive a corresponding word line signal WL0, WL1, . . . , WL5, respectively. String select switch SW is implemented as an N-type MOS (NMOS) transistor including a drain electrode coupled to metal bit line MBL, a source electrode coupled to memory cell MC0, and a gate electrode coupled to receive a string select line signal SSL. Ground select switch SWG is implemented as an N-type MOS transistor including a drain electrode coupled to memory cell MC5, a source electrode coupled to common source line CSL to receive a common source line signal CSL, and a gate electrode coupled to receive a ground select line signal GSL.

Y-select unit 320 includes a first NMOS transistor MN1. First NMOS transistor MN1 includes a drain electrode coupled to a node BLI, a source electrode coupled to metal bit line MBL, and a gate electrode coupled to receive a bit line select signal BLS. Bit line select signal BLS is configured to control whether metal bit line MBL is electrically isolated from sink unit 330, pre-charging unit 340, and sensing unit 350.

Sink unit 330 includes second and third NMOS transistors MN2 and MN3 coupled in series between node BLI and a reference voltage such as, for example, ground. Second NMOS transistor MN2 includes a drain electrode coupled to node BLI, a source electrode coupled to a drain electrode of NMOS transistor MN3, and a gate electrode coupled to receive a voltage $V_{DLB}$ at a node DLB in sensing unit 350. Third NMOS transistor MN3 includes the drain electrode coupled to the source electrode of NMOS transistor MN2, a source electrode coupled to ground, and a gate electrode coupled to receive a sink voltage Vsink having a predetermined voltage level.

Pre-charging unit 340 includes a first P-type MOS (PMOS) transistor MP1 and a fourth NMOS transistor MN4. First PMOS transistor MP1 includes a source electrode coupled to receive a power source voltage Vdd, a drain electrode coupled to a sensing node SEN, and a gate electrode coupled to receive a pre-charging control signal Power. Fourth NMOS transistor MN4 includes a drain electrode coupled to sensing node SEN, a source electrode coupled to node BLI, and a gate electrode coupled to receive a bit line clamp signal BLC.

Sensing unit 350 includes fifth through seventh NMOS transistors MN5, MN6, and MN7, second and third PMOS transistors MP2 and MP3, and a latch 352. Fifth NMOS transistor MN5 includes a drain electrode coupled to sensing node SEN, a source electrode coupled to an inverter node INV, and a gate electrode coupled to receive a pass signal. Latch 352 includes first and second inverters INV1 and INV2 cross-coupled between a node DL and node DLB. First inverter INV1 includes an input node coupled to node DL, an output node coupled to node DLB, and a control node coupled to receive a control signal SPOS. Second inverter INV2 includes an input node coupled to node DLB, an output node coupled to node DL, and a control node coupled to receive a control signal STBS. Sixth NMOS transistor MN6 is coupled between node DLB and inverter node INV, and includes a gate electrode coupled to receive a control signal PDLB. Seventh NMOS transistor MN7 is coupled between node DL and inverter node INV, and includes a gate electrode coupled to receive a control signal PDL. Second PMOS transistor MP2 includes a source electrode coupled to receive power source voltage Vdd, a drain electrode coupled to a source electrode of third PMOS transistor MP3, and a gate electrode coupled to receive a sense control signal STB. Third PMOS transistor MP3 includes the source electrode coupled to the drain electrode of second PMOS transistor MP2, a drain electrode coupled to inverter node INV, and a gate electrode coupled to sensing node SEN.

Figure 4:
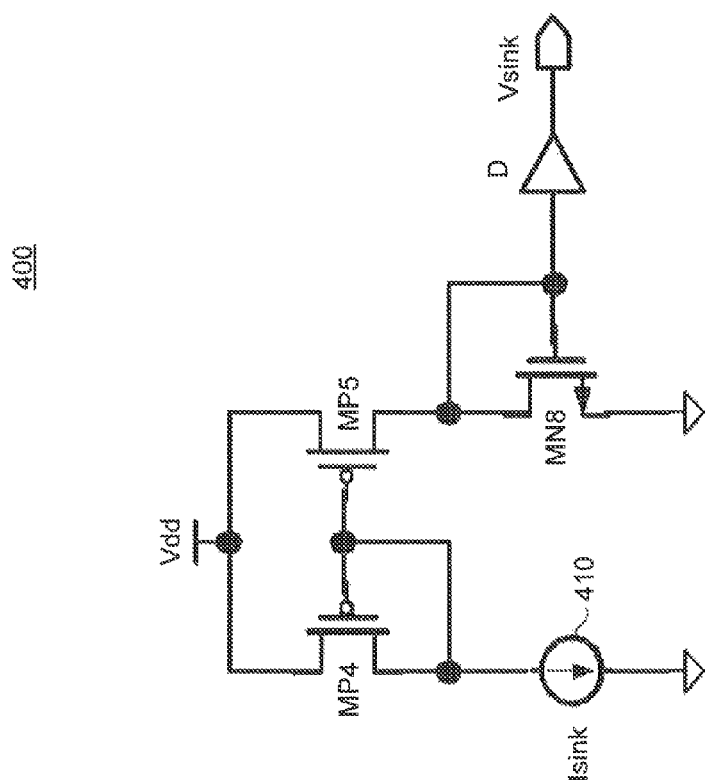
FIG. 4 is a circuit diagram of a sink current mirror circuit for generating a sink voltage, according to an illustrated embodiment.

FIG. 4 is a circuit diagram of a sink current mirror circuit 400 (hereinafter referred to as "circuit 400") for generating sink voltage Vsink illustrated in FIG. 3, according to an illustrated embodiment. As illustrated in FIG. 4, circuit 400 includes a current source 410, PMOS transistors MP4 and MP5, a NMOS transistor MN8, and an output buffer D.

Current source 410 is coupled between PMOS transistor MP4 and a reference voltage such as, for example, ground. Current source 410 generate a source current Isink having an adjustable current level. PMOS transistor MP4 includes a source electrode coupled to receive power source voltage Vdd, a drain electrode coupled to current source 410, and a gate electrode coupled to its drain electrode. PMOS transistor MP5 includes a source electrode coupled to receive power source voltage Vdd, a drain electrode coupled to NMOS transistor MN8, and a gate electrode coupled to the gate electrode PMOS transistor MP4. NMOS transistor MN8 includes a drain electrode coupled to the drain electrode of PMOS transistor MP5, a source electrode coupled to ground, and a gate electrode coupled to its drain electrode. Output buffer D includes a first terminal coupled to the gate electrode of NMOS transistor MN8, and a second terminal coupled to output sink voltage Vsink. Sink voltage Vsink is applied to the gate electrode of third NMOS transistor MN3 of circuit 300, as illustrated in FIG. 3.

Figure 5:
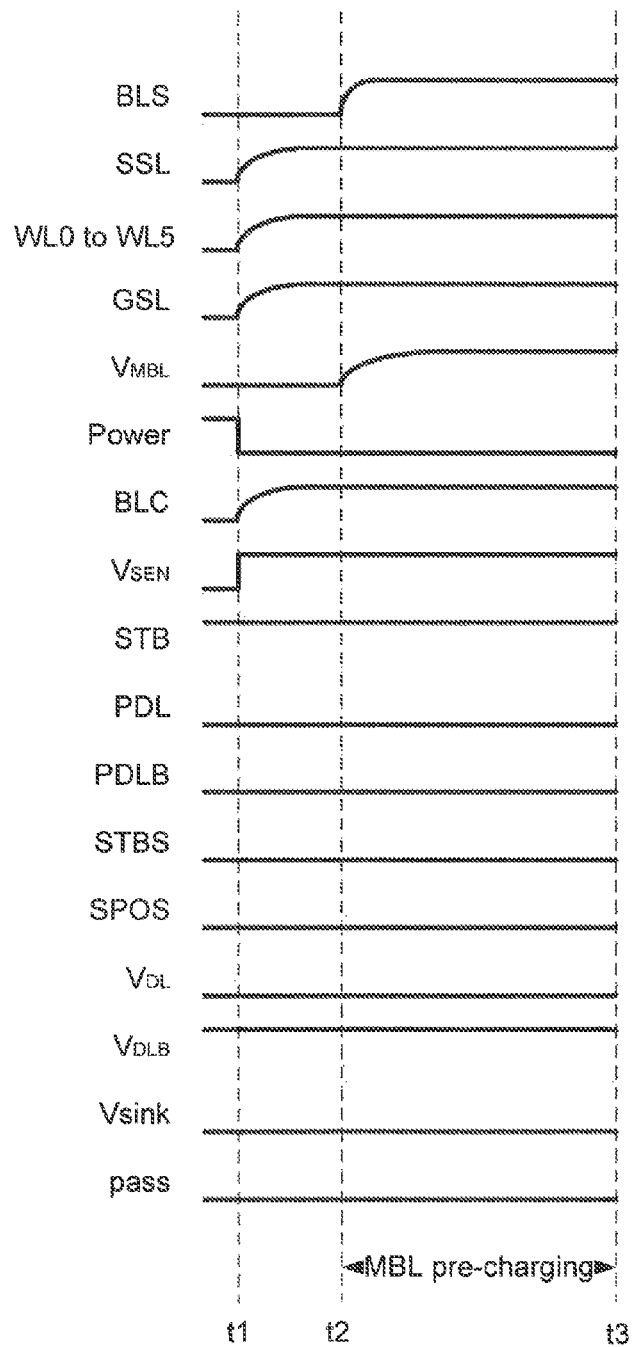
FIG. 5 is a timing diagram of various signals and voltages at various nodes illustrated in FIG. 3, according to a comparative example.

FIG. 5 is a timing diagram of various control signals and voltages at various nodes illustrated in FIG. 3, according to a comparative example. Memory controller 150 generates and controls the application of the various control signals.

As illustrated in FIG. 5, before time t1, bit line select signal BLS is configured to be a low voltage to turn off NMOS transistor MN1. As a result, Y-select unit 320 is disabled and metal bit line MBL is isolated from sink unit 330, pre-charging unit 340, and sensing unit 350. Before MBL pre-charging, metal bit line MBL is set to a reference voltage, e.g., ground, and thus voltage $V_{MBL}$ on metal bit line MBL is 0V. Pre-charging control signal Power is configured to be a high voltage to turn off first PMOS transistor MP1. Bit line clamp signal BLC is configured to be a low voltage to turn off fourth NMOS transistor MN4. As a result, pre-charging unit 340 is disabled and power source voltage Vdd is not applied to sensing node SEN of pre-charging unit 340. Consequently, voltage $V_{SEN}$ at sensing node SEN and voltage $V_{BLI}$ at node BLI are 0V. Sink voltage Vsink is configured to be a low voltage. As a result, sink unit 330 is disabled. Sense control signal STB is configured to be a high voltage to turn off second PMOS transistor MP2, and pass signal is configured to be a low voltage to turn off fifth NMOS transistor MN5. As a result, sensing unit 350 is disabled.

At time t1, string select line signal SSL is configured to transition from a low voltage to a high voltage to turn on string select switch SW. Ground select line signal GSL is configured to transition from a low voltage to a high voltage to turn on ground select switch SWG. Each one of word line signals WL0, WL1, . . . WL5 is configured to transition from a low voltage to a high voltage. Although word line signals WL0, WL1, . . . , WL5 illustrated in FIG. 5 have the same low and high voltage levels, the voltage levels of word line signals WL0, WL1, . . . , WL5 can be different from each other. For example, the word line signal corresponding to a selected memory cell (e.g., MC3) is configured to transition to a selected word line voltage Vselect, while the word line signals corresponding to the remaining memory cells (e.g., MC0, MC1, MC2, MC4, MC5) are configured to transition to a pass word line voltage Vpass to turn on the remaining memory cells.

In addition, at time t1, pre-charging control signal Power is configured to transition from the high voltage to a low voltage to turn on first PMOS transistor MP1. Bit line clamp signal BLC is configured to transition from the low voltage to a high voltage to turn on fourth NMOS transistor MN4. Bit line select signal BLS is configured to remain at the low voltage to turn off first NMOS transistor MN1. As a result, pre-charging unit 340 is enabled. Because first NMOS transistor MN1 is turned off, metal bit line MBL is isolated from pre-charging unit 340. Therefore, voltage $V_{SEN}$ at sensing node SEN increases to a high voltage due to the charge from power source voltage Vdd.

At time t2, bit line select signal BLS is configured to transition from the low voltage to a high voltage to turn on first NMOS transistor MN1. Pre-charging control signal Power remains as the low voltage, and bit line clamp signal BLC remains as the high voltage. As a result, a pre-charge current flows along a path from power source voltage Vdd, first PMOS transistor MP1, fourth NMOS transistor MN4, and first NMOS transistor MN1 to charge metal bit line MBL. Consequently, voltage $V_{MBL}$ at metal bit line MBL gradually increases.

At time t3, voltage $V_{MBL}$ at metal bit line MBL reaches a level such that a cell current is set to a design target. The cell current refers to the sensing current that flows through the selected memory cell during a sensing period.

The duration of the MBL pre-charging period is related to the loading (i.e., resistance and capacitance) of the metal bit line, as well as a sensing current that flows through metal bit line MBL. Smaller sensing current and larger metal bit line loading increase the duration of the MBL pre-charging period. In addition, referring to FIG. 2, when the selected memory cells coupled to some of metal bit lines MBL_0, MBL_1, . . . , MBL_M have low threshold voltages, while the selected memory cells coupled to other metal bit lines MBL_0, MBL_1, . . . , MBL_M have high threshold voltages, the charging currents of metal bit lines MBL_0, MBL_1, . . . , MBL_M are different. As a result, the durations of the MBL pre-charging periods of metal bit lines MBL_0, MBL_1, . . . , MBL_M are different. Undesirably, one of metal bit lines MBL_0, MBL_1, . . . , MBL_M can be affected by the charging current of a neighboring metal bit line due to the parasitic capacitance between the metal bit lines.

Figure 6:
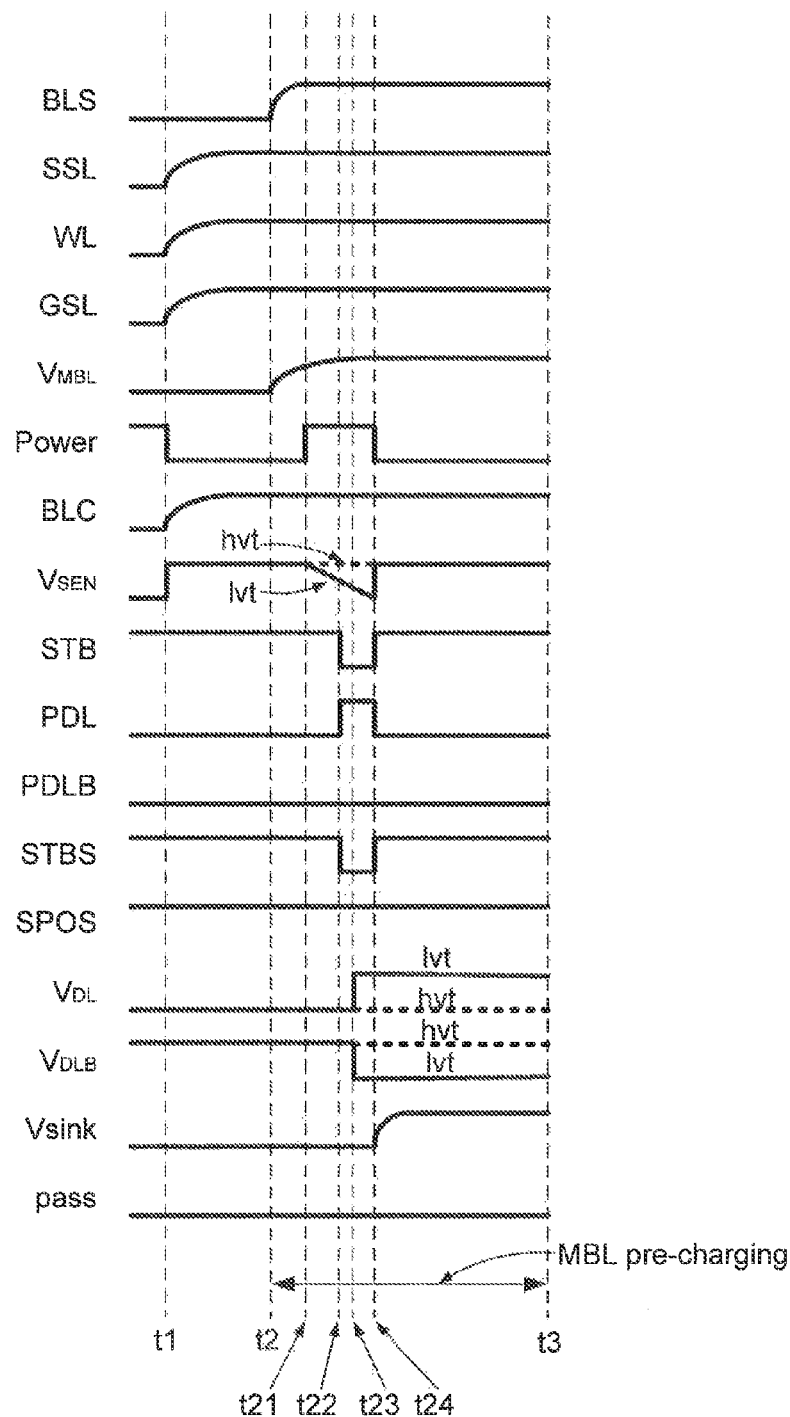
FIG. 6 is a timing diagram of various signals and voltages at various nodes illustrated in FIG. 3, according to an illustrated embodiment.

FIG. 6 is a timing diagram of various signals and voltages at various nodes illustrated in FIG. 3, according to an illustrated embodiment of the disclosure. Memory controller 150 generates and controls the application of the various control signals. The signals and voltages before and at time t2 in the illustrated embodiment are the same as the comparative example illustrated in FIG. 5. Therefore, detailed description thereof is not provided.

In the illustrated embodiment, during the MBL pre-charging period, i.e., when voltage $V_{MBL}$ at metal bit line MBL gradually increases, pre-charging control signal Power is configured to transition from the low voltage to the high voltage to turn off first PMOS transistor MP1 at a time t21. Bit line clamp signal BLC is configured to remain as the high voltage to turn on fourth NMOS transistor MN4. At this time, voltage $V_{SEN}$ at sensing node SEN is related to a current that flows through the parasitic capacitance of the metal bit line and the selected memory cell (e.g., MC3) at time t21, which represents the status of memory cell MC3 during the MBL pre-charging period. If the current is higher than a threshold current level, the threshold voltage of memory cell MC3 appears to be a low threshold voltage (lvt) at time t22. That is, memory cell MC3 behaves as an lvt cell during the MPE pre-charging period. The current that flows through MBL parasitic capacitance and memory cell MC3 flows through a path defined by sensing node SEN, fourth NMOS transistor MN4, first NMOS transistor MN1. As a result, voltage $V_{SEN}$ at sensing node gradually decreases, denoted as "lvt" in FIG. 6. On the other hand, if the current that flows through memory cell MC3 is lower than the threshold current level, the threshold voltage of memory cell MC3 appears to be a high threshold voltage (hvt) at time t22. That is, memory cell MC3 behaves as an hvt cell during the MPE pre-charging period. As a result, voltage $V_{SEN}$ at sensing node SEN remains substantially the same at the high voltage, denoted as "hvt" in FIG. 6.

At time t22, pre-charging control signal Power remains at the high voltage. Sense control signal STB is configured to transition from the high voltage to a low voltage to turn on second PMOS transistor MP2. Control signal PDL is configured to transition from the low voltage to a high voltage to turn on NMOS transistor MN7. Control signal STBS is configured to transition from the high voltage to a low voltage to turn off the ground path of the second inverter INV2, which may otherwise create a DC current path with MP2 and MP3. As a result, sensing unit 350 is partially enabled to sense voltage $V_{SEN}$ at sensing node SEN. At this time, voltage $V_{DL}$ at node DL and voltage $V_{DLB}$ at node DLB are related to voltage $V_{SEN}$ at sensing node SEN, which is in turn related to the current that flows through the selected memory cell, i.e., the status of the selected memory cell. If the threshold voltage of memory cell MC3 appears to be "lvt" during MBL pre-charging time, voltage $V_{SEN}$ decreases to a voltage level that is sufficiently low to turn on third PMOS transistor MP3, and thus voltage $V_{INV}$ at inverter node INV transitions to a high voltage. As a result, at time t23, voltage $V_{DL}$ at node DL transitions to a high voltage (denoted as "lvt" in FIG. 6), and voltage $V_{DLB}$ at node DLB transitions to a low voltage (denoted as "lvt" in FIG. 6). On the other hand, if the threshold voltage of memory cell MC3 appears to be "hvt" during MBL pre-charging time, voltage $V_{SEN}$ remains as the high voltage, third PMOS transistor MP3 remains turned off, and thus voltage $V_{INV}$ at inverter node INV remains as a low voltage. As a result, at time t23, voltage $V_{DL}$ at node DL remains as a low voltage (denoted as "hvt" in FIG. 6), and voltage $V_{DLB}$ at node DLB remains as a high voltage (denoted as "hvt" in FIG. 6).

At time t24, pre-charging control signal Power is configured to transition from the high voltage to the low voltage to turn on PMOS transistor MP1. Bit line clamp signal BLC is configured to remain as the high voltage to turn on NMOS transistor MN4. As a result, pre-charging unit 340 is turned on, and the pre-charging of metal bit line MBL resumes. Sense control signal STB is configured to transition from the low voltage to the high voltage to turn off second PMOS transistor MP2. Control signal PDL is configured to transition from the high voltage to the low voltage to turn off NMOS transistor MN7. Control signal STBS is configured to transition from the low voltage to the high voltage. As a result, sensing unit 350 is disabled. At this time, sink voltage Vsink is configured to transition from the low voltage to a high voltage. For example, sink voltage Vsink can transition from the low voltage to the high voltage by turning on current source 410 of circuit 400. As a result, sink unit 330 is enabled or disabled depending on voltage $V_{DLB}$ at node DLB, which is applied to second NMOS transistor MN2 of sink unit 330. If voltage $V_{DLB}$ at node DLB is the low voltage, i.e., the threshold voltage of memory cell MC3 appears to be "lvt", second NMOS transistor MN2 is turned off. As a result, sink unit 330 is disabled and does not conduct any sink current. On the other hand, if voltage $V_{DLB}$ at node DLB is the high voltage, i.e., the threshold voltage of memory cell MC3 appears to be "hvt", second NMOS transistor MN2 is turned on. As a result, sink unit 330 is turned on to conduct a sink current. The sink current helps to shorten the pre-charging time of metal bit line MBL.

During the pre-charging period and when pre-charging unit 340 is turned on, if the threshold voltage of the selected memory cell (e.g., MC3) appears to be the high threshold voltage, no current or small current flows between the source electrode of fourth NMOS transistor MN4 and metal bit line MBL. Thus, NMOS transistor MN4 is weakly turned on compared to a case when the threshold voltage of the selected memory cell MC3 appears to be the low threshold voltage in which NMOS transistor MN4 is largely turned on. Consequently, the charging rate of metal bit line MBL is relatively slow due to the weakly turned on of NMOS MN4. In the embodiment of the present disclosure, when sensing unit 350 detects that the threshold voltage of the selected memory cell (e.g., MC3) appears to be the high threshold voltage, sink unit 330 is turned on to conduct the sink current from the source electrode of NMOS transistor MN4 to ground. Thus, NMOS transistor MN4 is largely turned on. As a result, the charging rate of metal bit line MBL becomes relatively fast due to NMOS transistor MN4 being largely turned on.

In some embodiments, a sensing period (not illustrated) follows the MBL pre-charging period. During the sensing period, sink unit 330 is still enabled, first PMOS transistor MP1 of pre-charging unit 340 is turned off, fourth NMOS transistor MN4 of pre-charging unit 340 remains turned on, and sensing unit 350 is enabled to sense the data stored in the selected memory cell (e.g., MC3) according to voltage $V_{SEN}$ at sensing node SEN. If the selected memory cell (e.g., MC3) is judged as an hvt cell during the MBL pre-charging period, the sink current will not affect the sensing result during the sensing period. At this time, if the selected memory cell (e.g., MC3) has a low threshold voltage, memory cell MC3 is turned on, and a sensing current sense is generated. Sensing current Isense flows from metal bit line MBL, through memory cell MC3, and to common source line CSL. As a result, voltage $V_{SEN}$ at sensing node SEN gradually decreases to a low voltage. On the other hand, if memory cell MC3 has a high threshold voltage during the sensing period, memory cell MC3 is turned off, and no sensing current is generated. As a result, voltage $V_{SEN}$ at sensing node SEN remains as the high voltage. In this manner, by sensing voltage $V_{SEN}$ at node SEN, sensing unit 350 is capable of determining the data stored in the selected memory cell during the sensing period.

Figure 7:
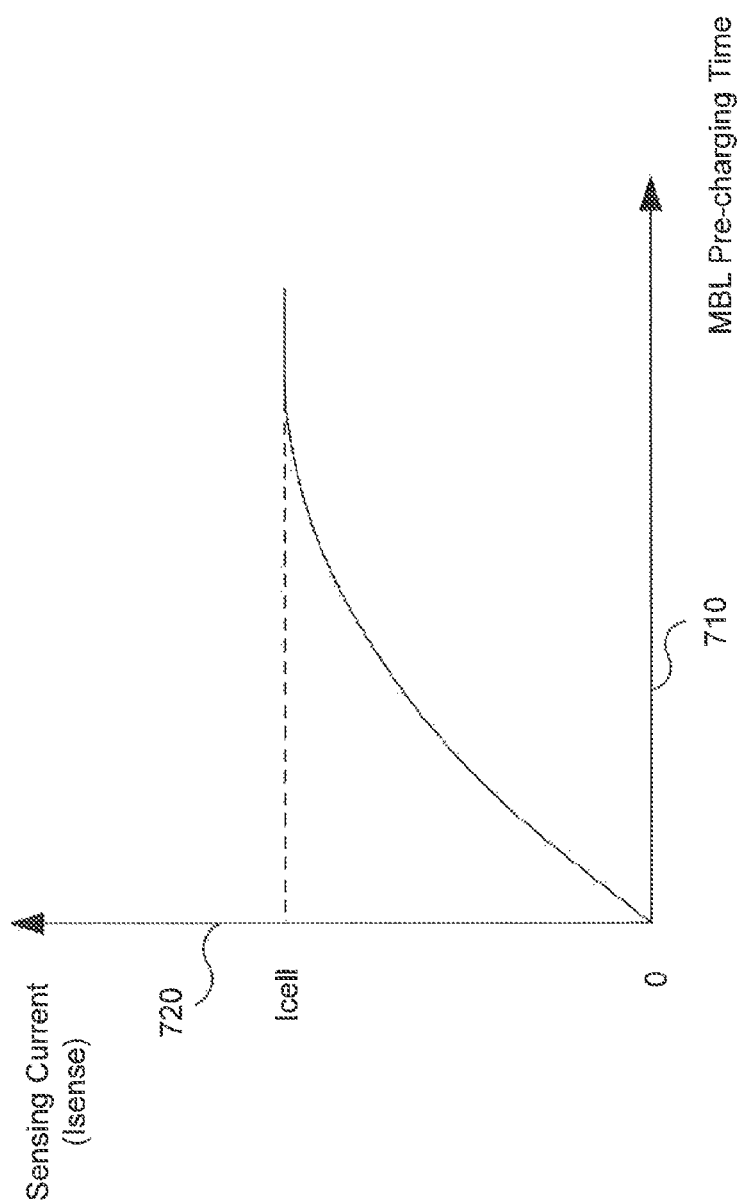
FIG. 7 is a graph that illustrates a relationship between the length of an MBL pre-charging period and a sensing current, according to an illustrated embodiment.

FIG. 7 is a graph that illustrates a relationship between the length of the MBL pre-charging period (hereinafter referred to as "MBL pre-charging time") and sensing current Isense that flows through a selected memory cell (e.g., MC3), according to an illustrated embodiment. In FIG. 7, abscissa 710 represents the MBL pre-charging time, and ordinate 720 represents sensing current Isense. As illustrated in FIG. 7, as the MBL pre-charging time gradually increases from 0, sensing current Isense gradually increases toward an ideal sensing current Icell that flows through memory cell MC3. Ideal sensing current Icell refers to a sensing current that flows through memory cell MC3 when the gate, source, and drain biases of memory cell MC3 are already setup within a setup time. The longer the pre-charging time, the smaller the difference between the ideal sensing current Icell and the sensing current Isense.

Figure 8:
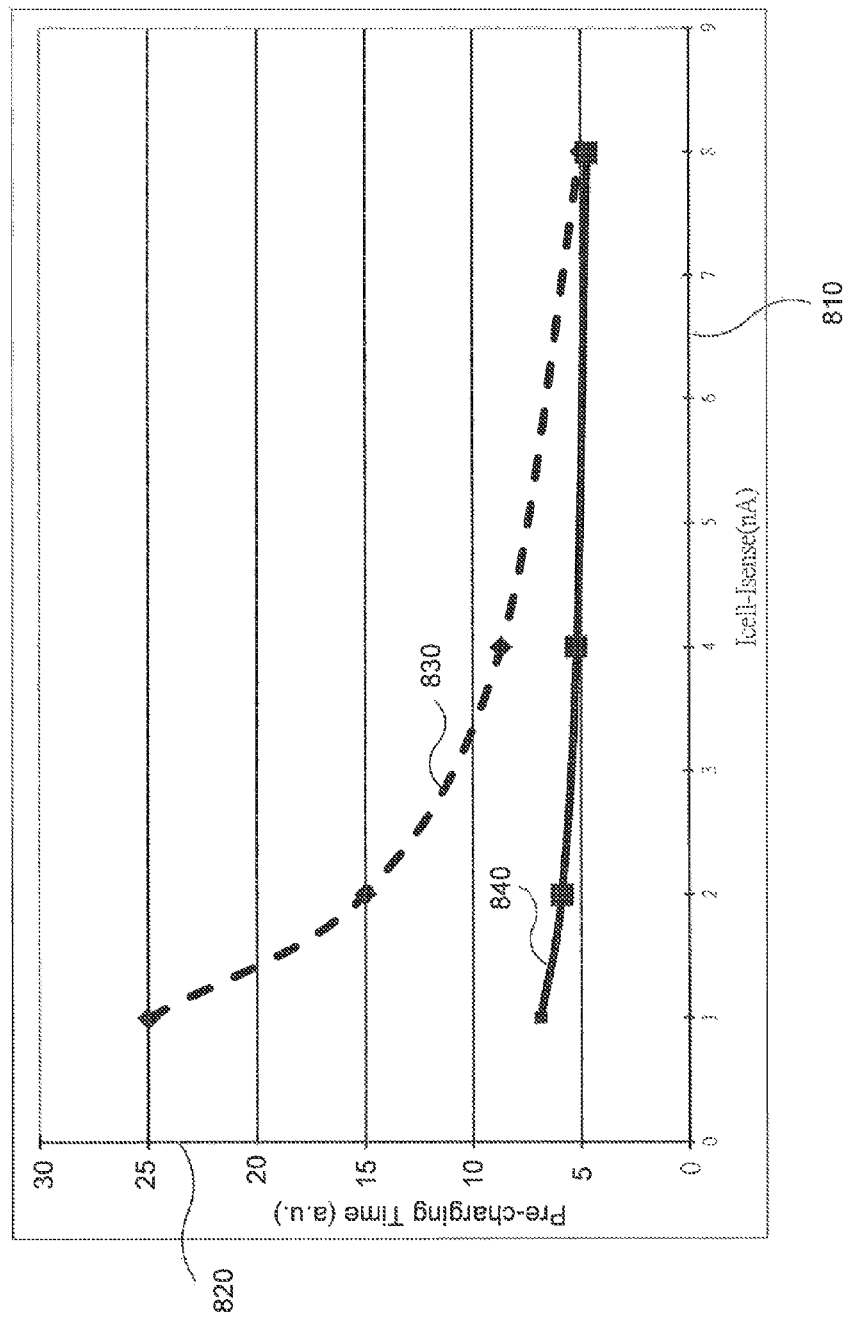
FIG. 8 is a graph that illustrates pre-charging characteristics of a memory circuit of a comparative example and the memory circuit illustrated in FIG. 3.

FIG. 8 is a graph that illustrates pre-charging characteristics of a memory circuit of a comparative example and of memory circuit 300. The memory circuit of the comparative example is similar to memory circuit 300, except that the memory circuit of the comparative example does not include sink unit 330 and its sensing unit does not sense the status of the selected memory cell during the pre-charging period. The control signals applied to the memory circuit of the comparative example are similar to those illustrated in FIG. 5, except that no sink voltage Vsink is applied since the memory circuit of the comparative example does not include sink unit 330.

In FIG. 8, abscissa 810 represents the difference Icell–Isense between the ideal sensing current Icell and the sensing current Isense in nano Ampere (nA), and ordinate 820 represents the MBL pre-charging time in arbitrary units (a.u.). Curve 830 represents the difference Icell–Isense of the memory circuit of the comparative example. Curve 840 represents the difference Icell–Isense of memory circuit 300. As illustrated in FIG. 8, the smaller the difference Icell–Isense, the longer the MBL pre-charging time is required. In addition, in order to obtain the same difference Icell–Isense, memory circuit 300 requires shorter MBL pre-charging time than the memory cell of the comparative example.

As described above, memory circuit 300 according to the illustrated embodiment of the disclosure includes sensing unit 350 for sensing the status of the selected memory cell during the pre-charging period, and sink unit 330 for providing a sink current based on the sensed status of the selected memory cell. As a result, the MBL pre-charging time can be shortened, and the memory chip can be operated faster.

In addition, when a plurality of metal bit lines are charged simultaneously during a pre-charging period, the metal bit lines having smaller charging currents can be identified (i.e., screened out) by their respective sensing units, and a sink current is provided to each one of the metal bit lines having smaller charging currents during the pre-charging period. In this manner, the pre-charging time variance across a plurality of metal bit lines caused by the variance of data stored in the memory cells can be compensated, thereby the consistency of the pre-charging time can be maintained, and the data stored in the memory cells can be sensed more accurately.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A memory circuit, comprising:
   a pre-charging unit configured to charge a metal bit line during a pre-charging period;
   a sensing unit configured to sense a status of a memory cell coupled to the metal bit line; and
   a sink circuit configured to provide a sink current during the pre-charging period based on the status of the memory cell sensed by the sensing unit.

2. The memory circuit of claim 1, wherein
   the sink circuit is configured to provide the sink current when the sensing unit senses that the memory cell behaves as a high threshold voltage cell during the pre-charging period, and
   the sink circuit configured not to provide the sink current when the sensing unit senses that the memory cell behaves as a low threshold voltage cell during the pre-charging period.

3. The memory circuit of claim 2, further including a select unit coupled between the pre-charging unit and the metal bit line.

4. The memory circuit of claim 3, wherein the select unit includes an N-type transistor coupled between the pre-charging unit and the metal bit line and controlled by a bit line select signal.

5. The memory circuit of claim 4, wherein the sink unit is coupled to a node located between the select unit and the pre-charging unit.

6. The memory circuit of claim 5, wherein the N-type transistor is a first N-type transistor,
   the sink unit including a second N-type transistor and a third N-type transistor coupled in series between the node and a reference voltage,
   the second N-type transistor being controlled by a voltage level related to the status of the memory cell sensed by the sensing unit during the pre-charging period, and
   the third N-type transistor being controlled by a sink voltage having a predetermined voltage level.

7. The memory circuit of claim 6, wherein the pre-charging unit includes a P-type transistor and a fourth N-type transistor coupled in series between a power supply voltage and the node,
   the P-type transistor being controlled by a pre-charging control signal, and
   the fourth N-type transistor being controlled by a bit line clamp signal.

8. The memory circuit of claim 7, wherein the node is a first node, the sensing unit being coupled to a second node located between the P-type transistor and the fourth N-type transistor.

9. The memory circuit of claim 1, wherein
   the pre-charging unit is configured to interrupt charging of the metal bit line during the pre-charging period,
   the sensing unit is configured to sense the status of the memory cell after the charging of the metal bit line is interrupted, and
   the pre-charging unit is configured to resume charging of the metal bit line after the status of the memory cell has been sensed.

10. The memory circuit of claim 1, wherein the sensing unit is configured to sense data stored in the memory cell during a sensing period.

11. A method of operating a memory circuit, comprising:
    charging, by a pre-charging unit, a metal bit line during a pre-charging period;
    sensing, by a sensing unit, a status of a memory cell coupled to the metal bit line; and
    providing, by a sink unit, a sink current during the pre-charging period based on the sensed status of the memory cell.

12. The method of claim 11, further including:
    providing the sink current during the pre-charging period when a current that flows through the memory cell is lower than a threshold current level.

13. The method of claim 12, further including:
    interrupting charging of the metal bit line during the pre-charging period;
    sensing the status of the memory cell after the charging of the metal bit line is interrupted; and
    resuming charging of the metal bit line after sensing the status of the memory cell.

14. A memory system, comprising:
    a memory array including a plurality of metal bit lines respectively coupled to corresponding ones of a plurality of strings of memory cells; and
    a memory controller coupled to the memory array for providing signals to the memory array to:
    charge a metal bit line during a pre-charging period;
    sense a status of a memory cell coupled to the metal bit line; and
    providing a signal to the memory array to provide a sink current during the pre-charging period based on the sensed status of the memory cell.

15. The memory system of claim 14, the memory controller further providing a signal to the memory array to provide the sink current during the pre-charging period when the memory cell has a high threshold voltage during the pre-charging period.

16. The memory system of claim 14, the memory controller further providing a signal to the memory array to provide the sink current during the pre-charging period when a current that flows through the memory cell is lower than a threshold current level.

17. The memory system of claim 14, the memory controller further providing signals to the memory array to:
    interrupt charging of the metal bit line during the pre-charging period;
    sense the status of the memory cell after the charging of the metal bit line is interrupted; and
    resume charging of the metal bit line after sensing the status of the memory cell.

* * * * *